United States Patent
Doris et al.

(10) Patent No.: US 10,224,327 B2
(45) Date of Patent: *Mar. 5, 2019

(54) SEMICONDUCTOR DEVICE WITH DIFFERENT FIN PITCHES

(71) Applicant: INTERNATIONAL BUSINESS MACHINES CORPORATION, Armonk, NY (US)

(72) Inventors: Bruce B. Doris, Slingerlands, NY (US); Terence B. Hook, Jericho, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/697,539

(22) Filed: Sep. 7, 2017

(65) Prior Publication Data
US 2017/0365601 A1  Dec. 21, 2017

Related U.S. Application Data

(63) Continuation of application No. 15/142,450, filed on Apr. 29, 2016, now Pat. No. 9,793,271.

(51) Int. Cl.
*H01L 27/088* (2006.01)
*H01L 21/8234* (2006.01)
(Continued)

(52) U.S. Cl.
CPC ...... *H01L 27/0886* (2013.01); *H01L 21/0271* (2013.01); *H01L 21/3081* (2013.01); *H01L 21/3086* (2013.01); *H01L 21/31116* (2013.01); *H01L 21/823418* (2013.01); *H01L 21/823431* (2013.01); *H01L 27/0207* (2013.01);
(Continued)

(58) Field of Classification Search
CPC .................................................. H01L 27/0886
See application file for complete search history.

(56) References Cited

U.S. PATENT DOCUMENTS 7,847,320 B2  12/2010  Anderson et al.
8,080,838 B2  12/2011  Chang et al.
(Continued)

OTHER PUBLICATIONS

Bruce B. Doris, et al., "Semiconductor Device With Different Fin Pitches", U.S. Appl. No. 15/142,450, filed Apr. 29, 2016.
(Continued)

*Primary Examiner* — William Coleman
(74) *Attorney, Agent, or Firm* — Cantor Colburn LLP; Vazken Alexanian

(57) ABSTRACT

A method for forming a semiconductor device includes forming a first fin and a second fin on a substrate, the first fin arranged in parallel with the second fin, the first fin arranged a first distance from the second fin, the first fin and the second fin extending from a first source/drain region through a channel region and into a second source/drain region on the substrate. The method further includes forming a third fin on the substrate, the third fin arranged in parallel with the first fin and between the first fin and the second fin, the third fin arranged a second distance from the first fin, the second distance is less than the first distance, the third fin having two distal ends arranged in the first source/drain region. A gate stack is formed over the first fin and the second fin.

20 Claims, 27 Drawing Sheets

(51) Int. Cl.
  *H01L 29/161* (2006.01)
  *H01L 29/66* (2006.01)
  *H01L 21/027* (2006.01)
  *H01L 21/308* (2006.01)
  *H01L 21/311* (2006.01)
  *H01L 27/02* (2006.01)

(52) U.S. Cl.
  CPC ........ *H01L 29/161* (2013.01); *H01L 29/6653* (2013.01); *H01L 29/66545* (2013.01)

(56) References Cited

U.S. PATENT DOCUMENTS

| | | |
|---|---|---|
| 9,589,956 B1 | 3/2017 | Doris et al. |
| 9,653,463 B1 | 5/2017 | Doris et al. |
| 9,793,271 B1 * | 10/2017 | Doris .................. H01L 27/0886 |
| 2017/0207217 A1 | 7/2017 | Hellings et al. |

OTHER PUBLICATIONS

List of IBM Patents or Patent Applications Treated as Related; (Appendix P), Filed Sep. 7, 2017, 2 pages.

* cited by examiner

SEMICONDUCTOR DEVICE WITH DIFFERENT FIN PITCHES

DOMESTIC PRIORITY

This application is a Continuation of Non-Provisional application Ser. No. 15/142,450, entitled "SEMICONDUCTOR DEVICE WITH DIFFERENT FIN PITCHES", filed Apr. 29, 2016, the contents of which are incorporated by reference.

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The MOSFET has a source, a drain and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device includes forming a first fin and a second fin on a substrate, the first fin arranged in parallel with the second fin, the first fin arranged a first distance from the second fin, the first fin and the second fin extending from a first source/drain region through a channel region and into a second source/drain region on the substrate. The method further includes forming a third fin on the substrate, the third fin arranged in parallel with the first fin and between the first fin and the second fin, the third fin arranged a second distance from the first fin, the second distance is less than the first distance, the third fin having two distal ends arranged in the first source/drain region. A gate stack is formed over the first fin and the second fin.

According to another embodiment of the present invention a semiconductor device comprises a first semiconductor fin arranged on a substrate, the first semiconductor fin having a first distal end, a second distal end, and a medial region arranged between the first distal end and the second distal end, the first distal end of the first semiconductor fin arranged in a first source/drain region and the second distal end of the second semiconductor fin arranged in a second source/drain region. The device further comprises a second semiconductor fin arranged on the substrate, the second semiconductor fin having a first distal end, a second distal end, and a medial region arranged between the first distal end and the second distal end, the second distal end of the second semiconductor fin arranged in the first source/drain region and the second distal end of the second semiconductor fin arranged in the second source/drain region. A third semiconductor fin is arranged on the substrate, the third semiconductor fin having a first distal end, a second distal end, and a medial region arranged between the first distal end and the second distal end, the first distal end and the second distal end of the third semiconductor fin arranged in the first source/drain region. The first semiconductor fin, the second semiconductor fin, and the third semiconductor fin are arranged substantially in parallel with each other, the third semiconductor fin is arranged between the first semiconductor fin and the second semiconductor fin, the first semiconductor fin is arranged a first distance from the second semiconductor fin and the third semiconductor fin is arranged a second distance from the first semiconductor fin, the first distance greater than the second distance. A gate stack is arranged over a channel region of the first semiconductor fin and the second semiconductor fin between the first source/drain region and the second source/drain region.

According to yet another embodiment of the present invention, a method for forming a semiconductor device comprises forming a mandrel on a substrate, forming sacrificial sidewall spacers along sidewalls of the mandrel, and removing the mandrel. The method further comprises removing portions of the substrate to form an arrangement of fins on the substrate. The arrangement of fins includes a first fin arranged substantially in parallel with a second fin in a source/drain region, the first fin arranged a first distance from the second fin and a third fin arranged substantially in parallel with a fourth fin in a channel region, the third fin arranged a second distance from the fourth fin, the second distance is greater than the first distance. The sacrificial sidewall spacers are removed and a gate stack is formed over the channel region.

According to yet another embodiment of the present invention, a semiconductor device comprises a first semiconductor fin arranged in parallel with a second semiconductor fin in a first source/drain region on a substrate. The first semiconductor fin is arranged a first distance from the second semiconductor fin. The device further comprises a third semiconductor fin arranged in parallel with a fourth semiconductor fin in a channel region on the substrate, the third semiconductor fin is arranged a second distance from the fourth semiconductor fin, the second distance greater than the first distance, the first semiconductor fin contacting the third semiconductor fin and the second semiconductor fin contacting the fourth semiconductor fin. A gate stack is arranged over the channel region of the third semiconductor fin and the fourth semiconductor fin.

According to yet another embodiment of the present invention, a method for forming a semiconductor device comprises forming a mandrel on a substrate, forming sacrificial sidewall spacers along sidewalls of the mandrel, and removing the mandrel. Portions of the substrate are removed to form an arrangement of fins on the substrate. The arrangement of fins includes a first fin arranged substantially in parallel with a second fin in a source/drain region, the first fin is arranged a first distance from the second fin and a third fin is arranged substantially in parallel with a fourth fin in a channel region. The third fin is arranged a second distance from the fourth fin, the first distance is greater than the second distance. The sacrificial sidewall spacers are removed, and a gate stack is formed over the channel region.

According to yet another embodiment of the present invention, a semiconductor device comprises a first semiconductor fin arranged in parallel with a second semiconductor fin in a first source/drain region on a substrate, the first semiconductor fin arranged a first distance from the second semiconductor fin. The device further comprises a third semiconductor fin arranged in parallel with a fourth semiconductor fin in a channel region on the substrate, the third semiconductor fin is arranged a second distance from the fourth semiconductor fin, the first distance is greater than the second distance. The first semiconductor fin contacts the third semiconductor fin and the second semiconductor fin contacts the fourth semiconductor fin. A gate stack is arranged over the channel region of the third semiconductor fin and the fourth semiconductor fin.

BRIEF DESCRIPTION OF THE DRAWINGS

FIG. 1 illustrates a side view of a semiconductor substrate, a hardmask arranged on the substrate, and a sacrificial layer arranged on the hardmask.

FIG. 2 illustrates a top view following the patterning of a mask on the semiconductor layer.

FIG. 3 illustrates a top view following an anisotropic etching process.

FIG. 4 illustrates a cut-away view along the line A-A (of FIG. 3) showing a portion of the mandrel arranged on the hardmask.

FIG. 5 illustrates a cut-away view along the line B-B (of FIG. 3) showing another portion of the mandrel arranged on the hardmask.

FIG. 6 illustrates a top view following the formation of sacrificial sidewall spacers along sidewalls of the mandrel.

FIG. 7 illustrates a cut-away view along the line A-A (of FIG. 6) of a portion of the sacrificial sidewall spacers.

FIG. 8 illustrates a cut-away view along the line B-B (of FIG. 6) of another portion of the sacrificial sidewall spacers.

FIG. 9 illustrates a top view following the removal of the mandrel (of FIG. 6).

FIG. 10 illustrates a top view following a selective etching process that removes exposed portions of the hardmask and the substrate to form fins.

FIG. 11 illustrates a cut-away view along the line A-A (of FIG. 10) of fins that are arranged on the substrate.

FIG. 12 illustrates a cut-away view along the line B-B (of FIG. 10) of another portion of the fins.

FIG. 13 illustrates a top view following the removal of the sacrificial sidewall spacers (of FIG. 10), which exposes the hardmask.

FIG. 14 illustrates a top view following the formation of a sacrificial gate over the fins (of FIG. 13) and spacers adjacent to sidewalls of the sacrificial gate.

FIG. 15 illustrates a top view following the formation of source/drain regions over the fins (of FIG. 14).

FIG. 16 illustrates a cut-away view along the line A-A (of FIG. 15) of the fins the substrate and the source/drain region formed over the fins and the substrate.

FIG. 17 illustrates a top view following the formation of an inter-level dielectric layer and the removal of the sacrificial gate (of FIG. 15) to form a cavity that exposes the channel regions of the fins.

FIG. 18 illustrates a top view of the resultant structure following the formation of a replacement metal gate stack.

FIG. 19 illustrates a cut-away view along the line B-B (of FIG. 18) of the gate stack.

FIG. 20 illustrates a top view of following the formation of sacrificial sidewall spacers along sidewalls of the mandrel.

FIG. 21 illustrates a top view following an anisotropic etching process that removes exposed portions of the substrate and forms fins.

FIG. 22 illustrates a cut-away view along the line A-A (of FIG. 21) of the fins.

FIG. 23 illustrates a cut-away view along the line B-B (of FIG. 21) of the fins.

FIG. 24 illustrates a cut-away view along the line C-C (of FIG. 21) of the fins and a merged fin portion.

FIG. 25 illustrates a top view following the formation of a gate stack and spacers along sidewalls of the gate stack.

FIG. 28 illustrates a top view of an arrangement of fins on a substrate.

FIG. 29 illustrates a top view following the formation of a sacrificial gate stack, spacers, and source/drain regions over the fins (of FIG. 28).

FIG. 30 illustrates a top view following the formation of an inter-level dielectric layer over the source/drain regions (of FIG. 29) and a replacement gate stack over channel regions of the fins.

FIG. 31 illustrates a cut-away view along the line A-A (of FIG. 30) of the fins and the source/drain region.

FIG. 32 illustrates a cut-away view along the line B-B (of FIG. 30) of the fins and the gate stack arranged over the fins.

DETAILED DESCRIPTION

FinFETs typically include a fin that has a three dimensional profile arranged on a substrate. Previous finFETs often included a fin that has a channel region, a gate stack arranged over the channel region and source/drain regions on opposing sides of the channel region. The size and shape of the fin was substantially uniform through the source/drain regions and the channel region.

In finFET devices with multiple fins arranged in parallel on a substrate, the spacing between the fins (i.e., fin pitch) was substantially uniform between the portions of the fins in the source/drain region and the channel regions. In other words, for a pair of identical fins arranged adjacent to each other and in parallel on a substrate, the distance between the fins is the same in the channel region and the source/drain region.

For high voltage finFETs or some other types of finFETs, a relatively thick gate dielectric and work function metal are desirable to meet performance parameters of such devices. However, as the fin pitch is reduced in order to reduce the scale of the devices on the substrate, the space available between the fins in the channel region becomes smaller. If the desired thickness of the gate dielectric and work function metal is relatively thick compared to the distance between the fins in the channel region, there simply may not be enough space between the fins in the channel region to form a proper multi-gate device.

The illustrated exemplary methods and embodiments describe a finFET device that has fins in the channel region that are sufficiently pitched to allow the deposition of gate dielectric and work function metals at a desired thickness while maintaining the desired performance characteristics of a multi-gate device. The embodiments described herein further provide for fins in the source/drain regions that are spaced at a different pitch than the channel region to allow a uniform formation of epitaxially grown source/drain regions.

FIGS. 1-19 illustrate an exemplary method for fabricating a finFET device using a sidewall image transfer process with fins having a greater fin pitch in the channel region and a smaller fin pitch in the source/drain regions.

Figure 1:
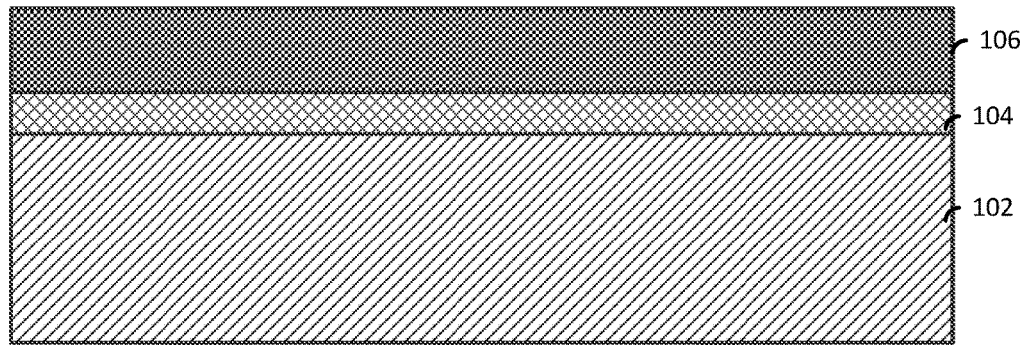
FIGS. 1-19 illustrate an exemplary method for fabricating a finFET device using a sidewall image transfer process with fins having a greater fin pitch in the channel region and a smaller fin pitch in the source/drain regions.

FIG. 1 illustrates a side view of a semiconductor substrate 102, a hardmask 104 arranged on the substrate 102, and a sacrificial layer 106 arranged on the hardmask 104.

Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

The hardmask 104 may include, for example, silicon oxide, silicon nitride (SiN), SiOCN, SiBCN or any suitable combination of those. The hardmask 104 may be deposited using a deposition process, including, but not limited to, PVD, CVD, PECVD, or any combination thereof. The sacrificial layer 106 may include, any suitable material such as, for example, amorphous carbon or amorphous silicon.

Figure 2:
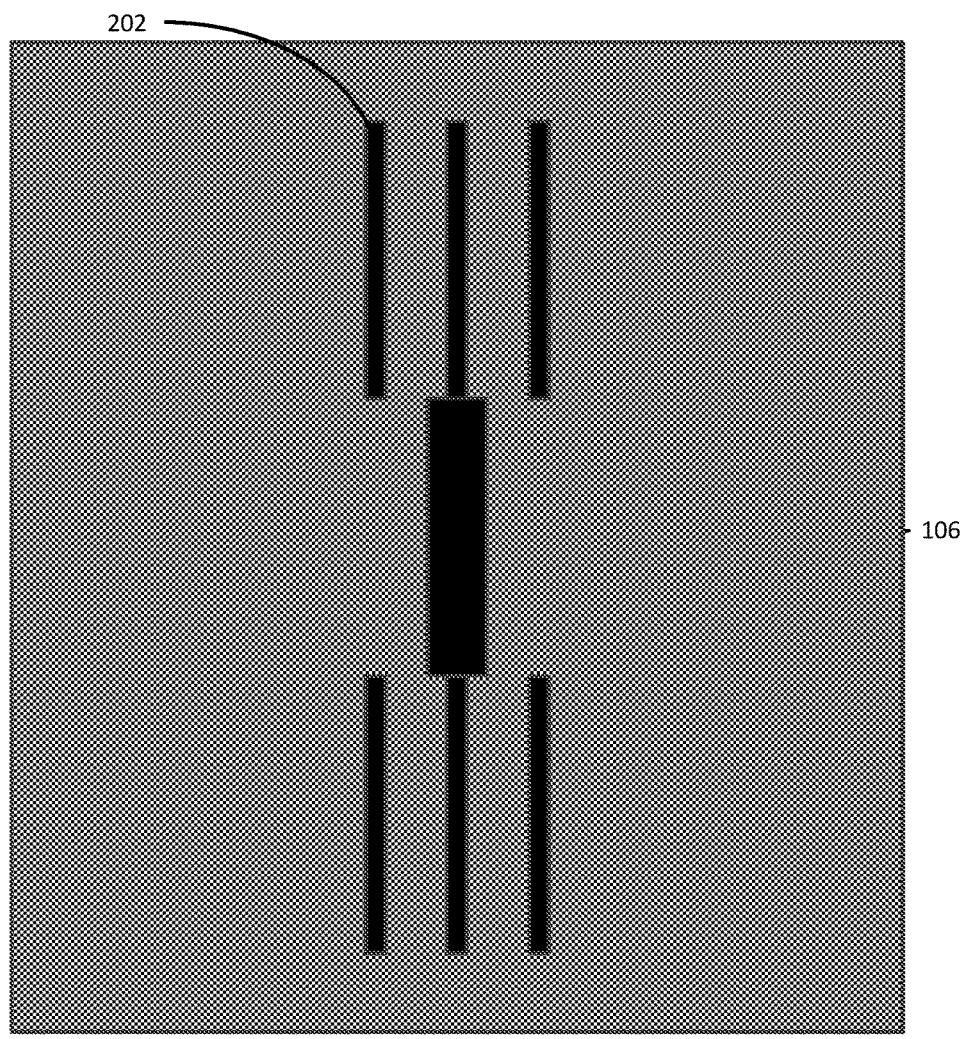

FIG. 2 illustrates a top view following the patterning of a mask 202 on the sacrificial layer 106. Suitable resist masks include photoresists, electron-beam resists, ion-beam resists, X-ray resists and etch resists. The resist may a polymeric spin on material or a polymeric material.

Figure 3:
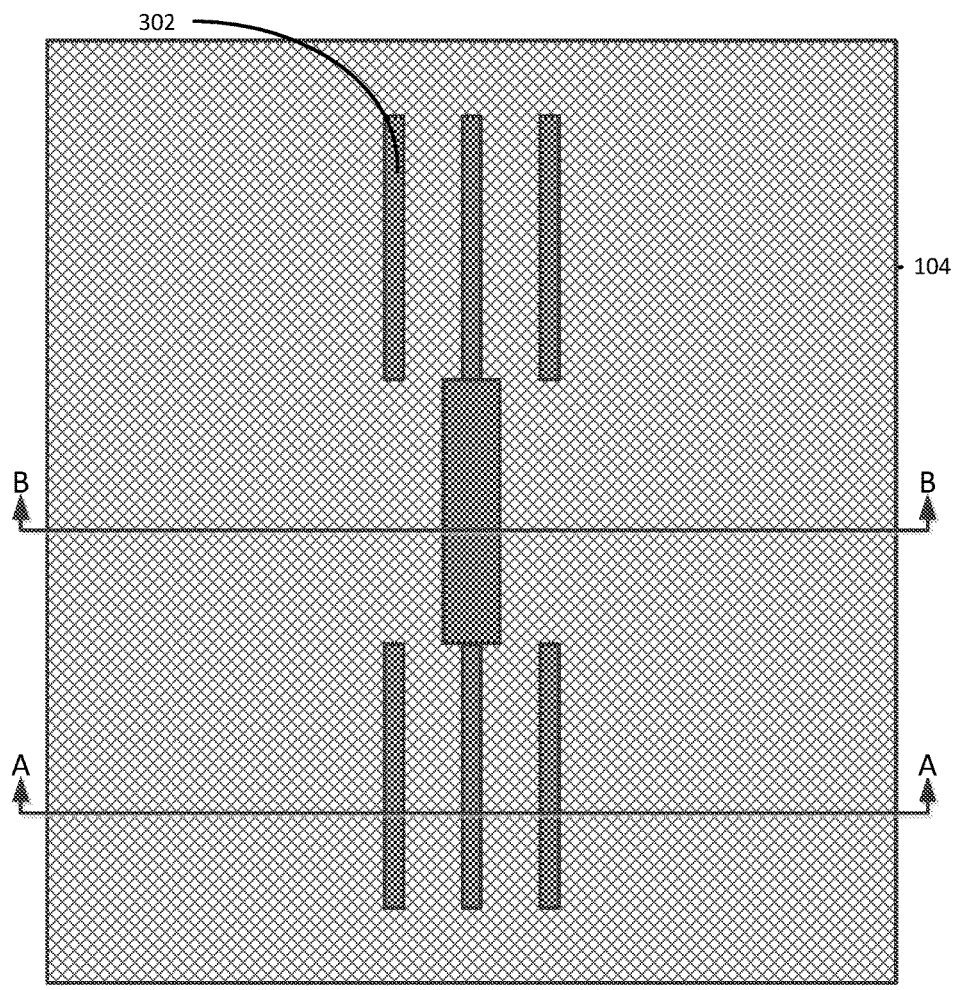

FIG. 3 illustrates a top view following an anisotropic etching process such as, for example, reactive ion etching that removes exposed portions of the sacrificial layer 106 (of FIG. 2) to form a mandrel 302 arranged on the hardmask 104.

Figure 4:
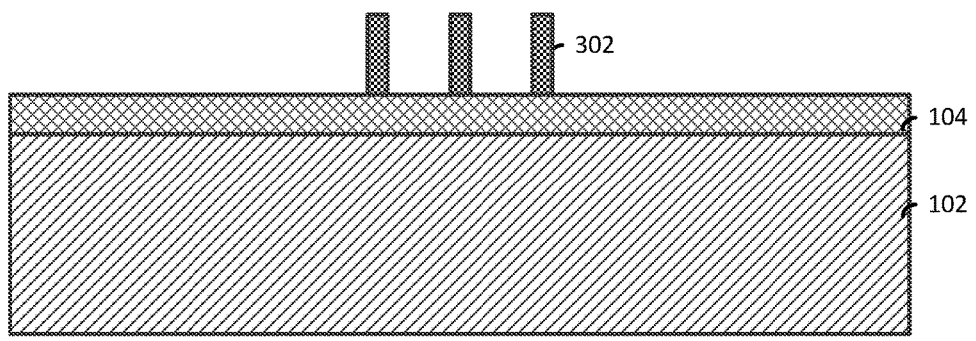
Figure 5:
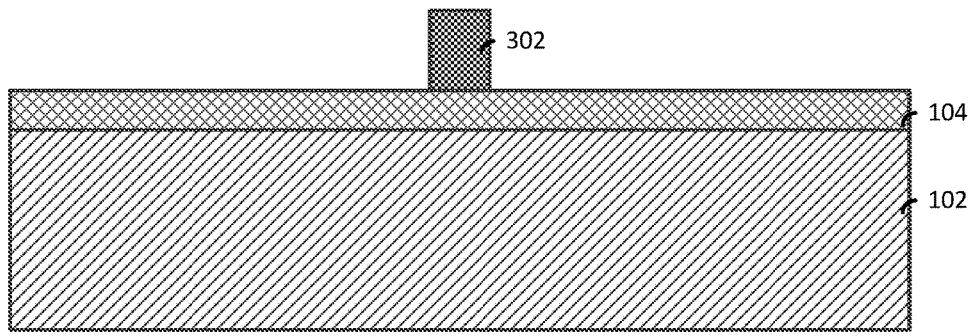

FIG. 4 illustrates a cut-away view along the line A-A (of FIG. 3) showing a portion of the mandrel 302 arranged on the hardmask 104. FIG. 5 illustrates a cut-away view along the line B-B (of FIG. 3) showing another portion of the mandrel 302 arranged on the hardmask 104.

Figure 6:
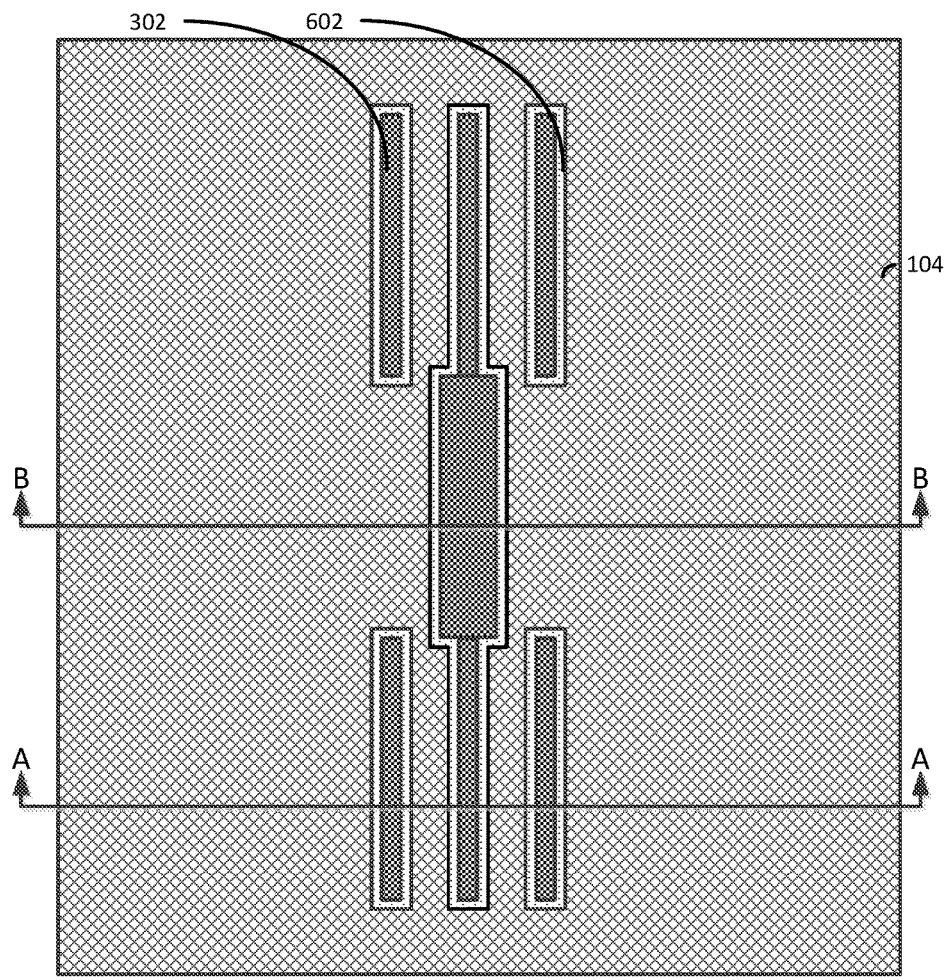

FIG. 6 illustrates a top view following the formation of sacrificial sidewall spacers 602 along sidewalls of the mandrel 302. The sacrificial sidewall spacers 602 may be formed by, for example, depositing a layer of spacer material (not shown) over the exposed portions of the hardmask 104 and the mandrel 302. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form sacrificial sidewall spacers 602.

Figure 7:
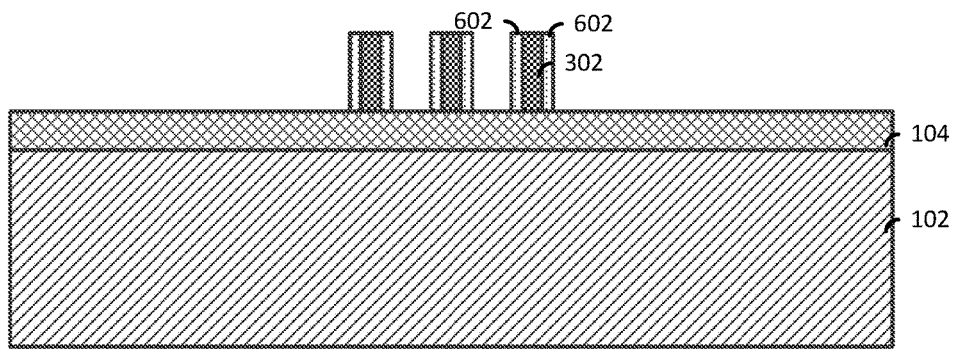
Figure 8:
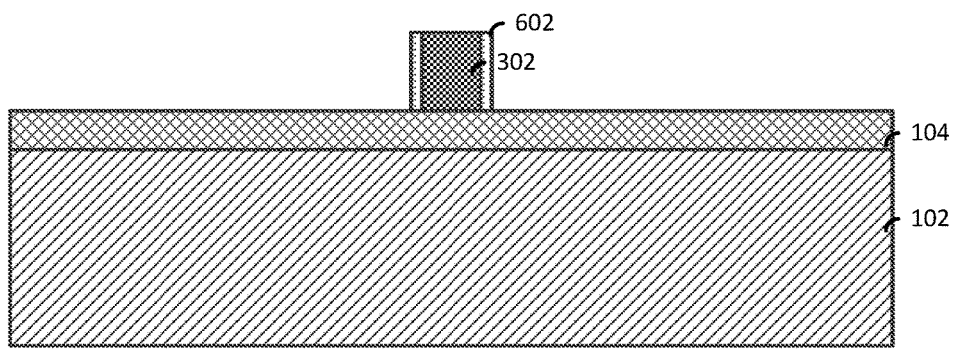

FIG. 7 illustrates a cut-away view along the line A-A (of FIG. 6) of a portion of the sacrificial sidewall spacers 602. FIG. 8 illustrates a cut-away view along the line B-B (of FIG. 6) of another portion of the sacrificial sidewall spacers 602.

Figure 9:
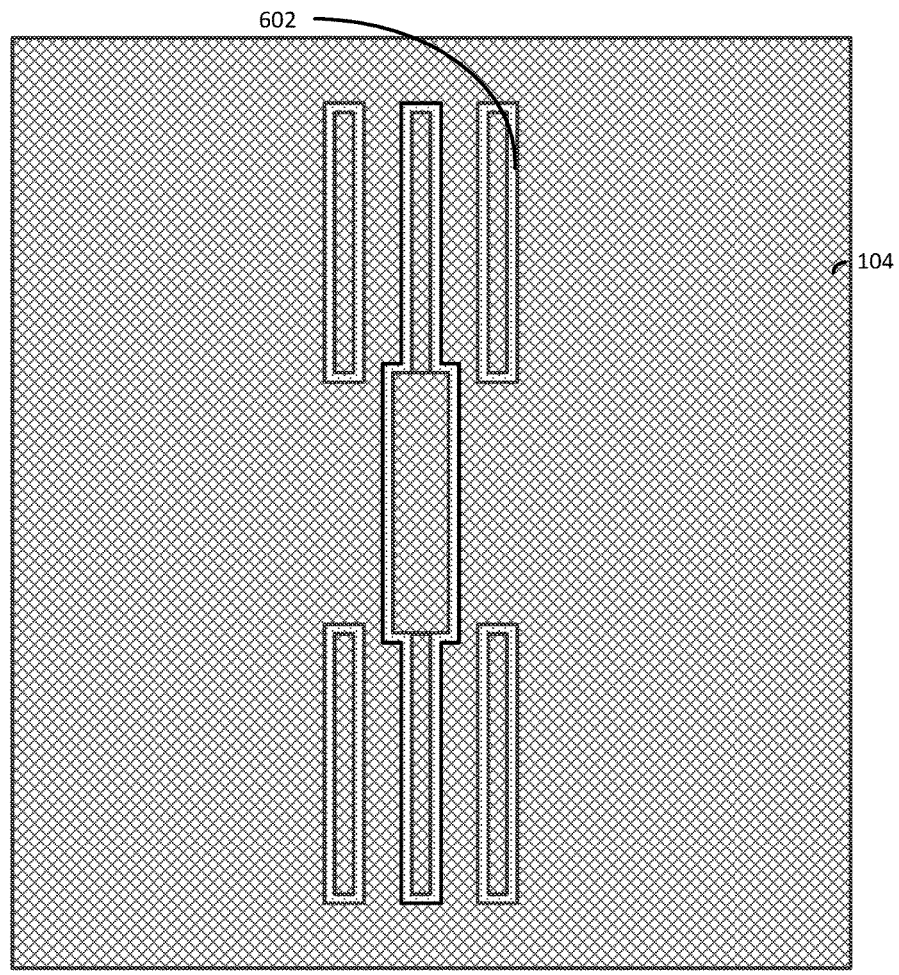

FIG. 9 illustrates a top view following the removal of the mandrel 302 (of FIG. 6) using a suitable selective etching process that selectively removes the mandrel 302 without substantially removing or damaging the sacrificial sidewall spacers 602 or the hardmask 104.

Figure 10:
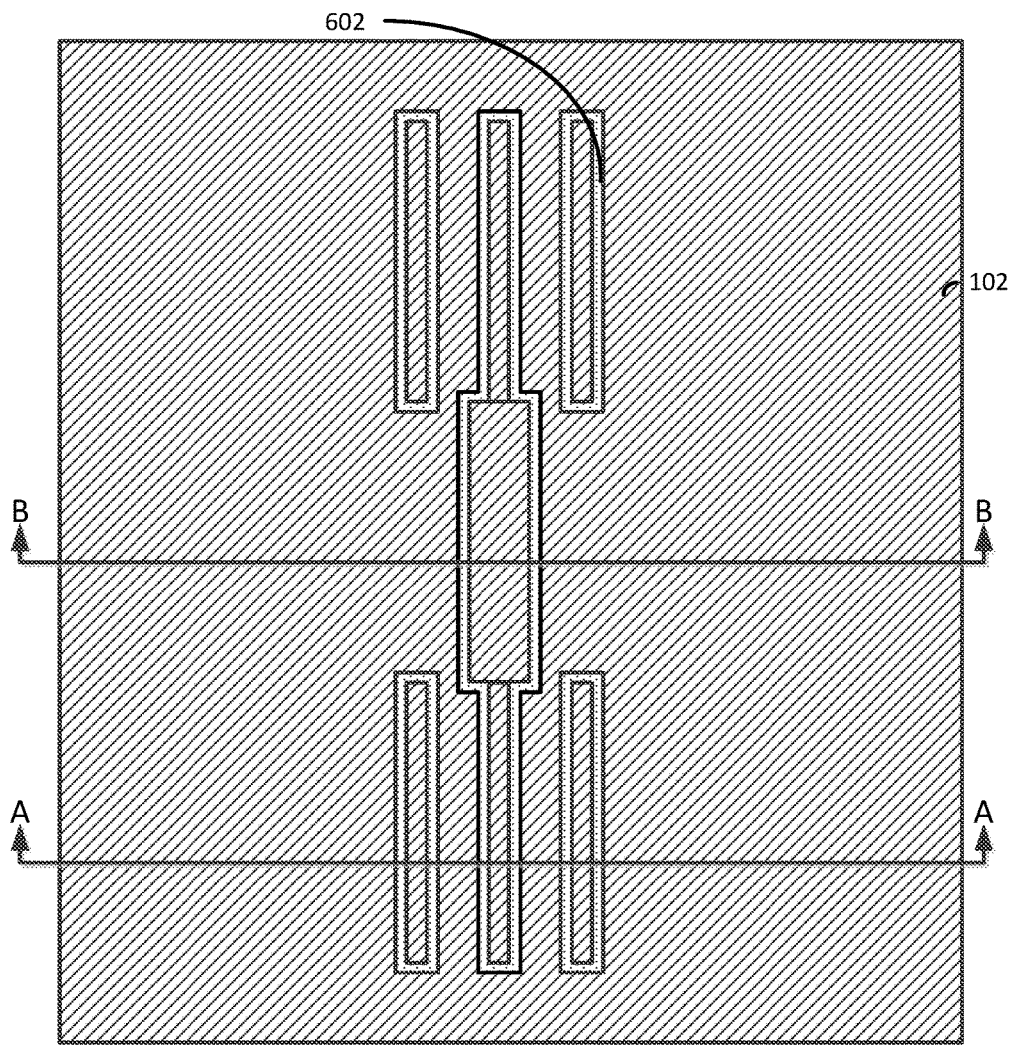

FIG. 10 illustrates a top view following a selective etching process that removes exposed portions of the hardmask 104 and the substrate 102 to form fins.

Figure 11:
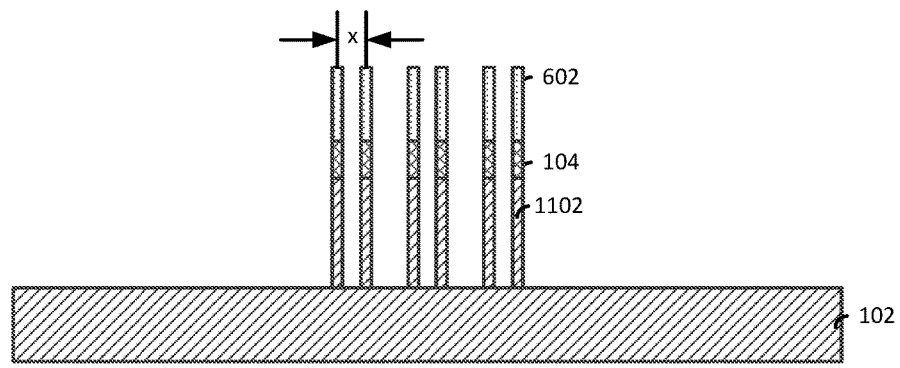
Figure 12:
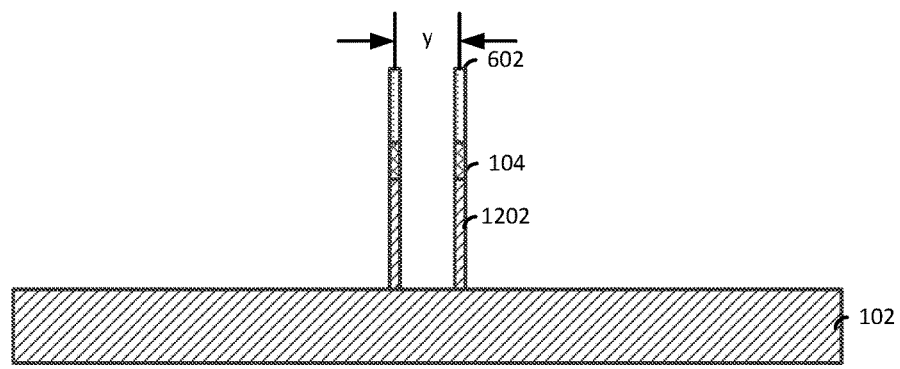

FIG. 11 illustrates a cut-away view along the line A-A (of FIG. 10) of fins 1102 that are arranged on the substrate 102. The fins 1102 are spaced (pitched) a distance x and will be used in subsequent fabrication processes to form the source/drain regions of the finFET device. FIG. 12 illustrates a cut-away view along the line B-B (of FIG. 10) of another portion of the fins 1202 that are pitched a distance y and will be used in subsequent fabrication processes to form the channel region of the device. In the illustrated exemplary embodiment shown in FIGS. 11-12 the distance x is less than the distance y.

Figure 13:
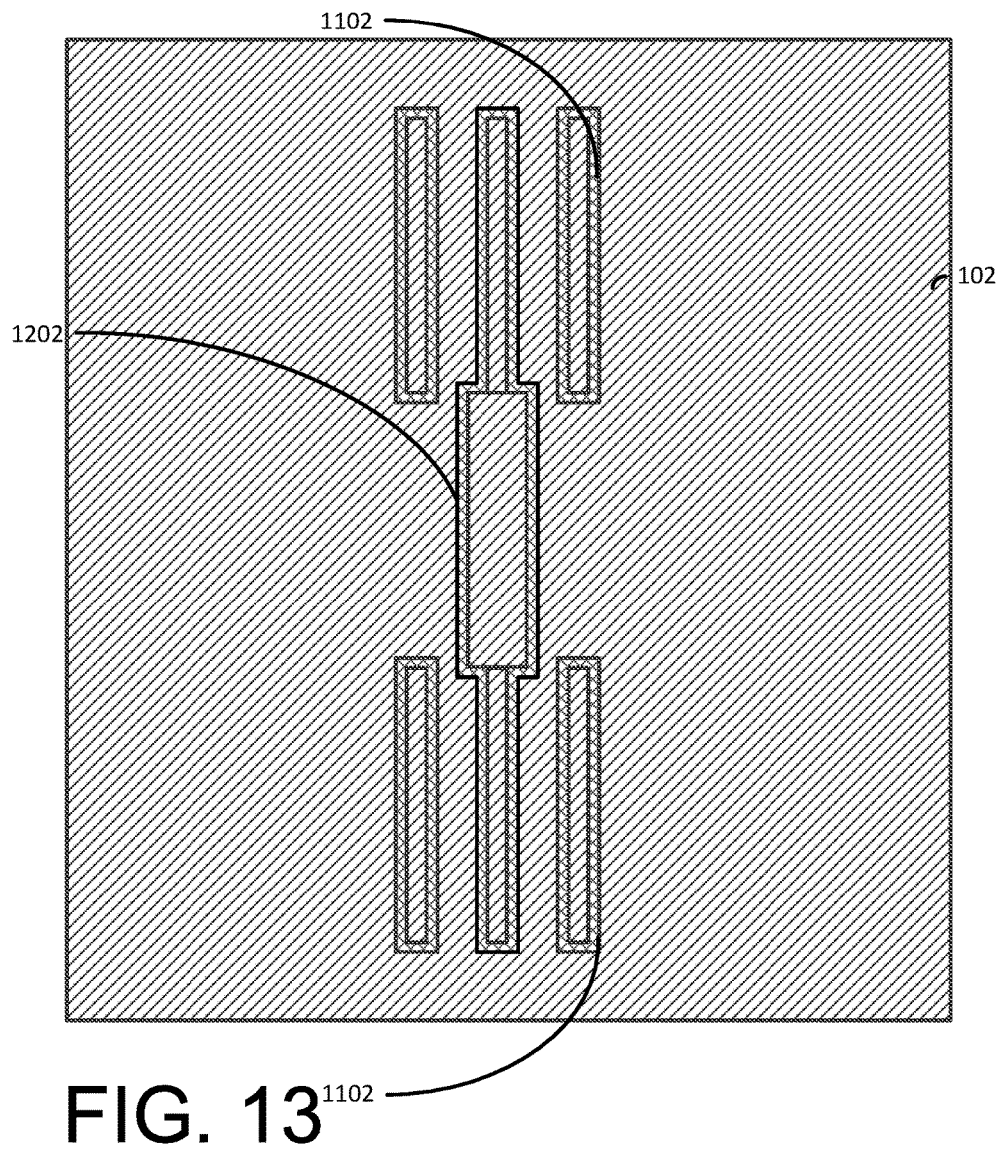

FIG. 13 illustrates a top view following the removal of the sacrificial sidewall spacers 602 (of FIG. 10), which exposes the hardmask 104.

Figure 14:
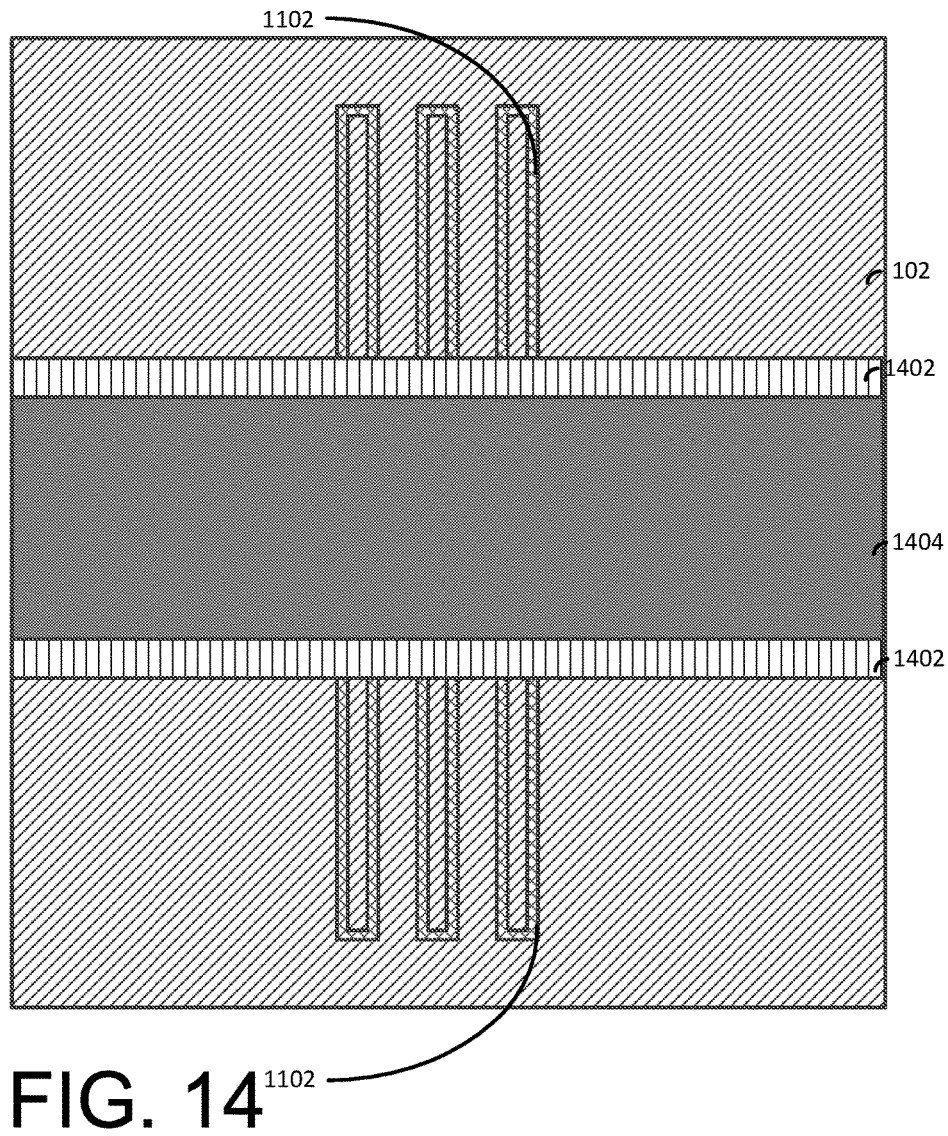

FIG. 14 illustrates a top view following the formation of a sacrificial gate 1404 over the fins 1202 (of FIG. 13) and spacers 1402 adjacent to sidewalls of the sacrificial gate 1404.

The sacrificial gates 1404 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 1404 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap (not shown). The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 1404 and the sacrificial gate caps.

In FIG. 14, spacers 1402 are formed adjacent to the sacrificial gates 1404. The spacers 1402 in the illustrated embodiment are formed by depositing a layer of spacer material (not shown) over the exposed portions of the substrate 102, the fins 1202, and the sacrificial gates 1404. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1402.

Figure 15:
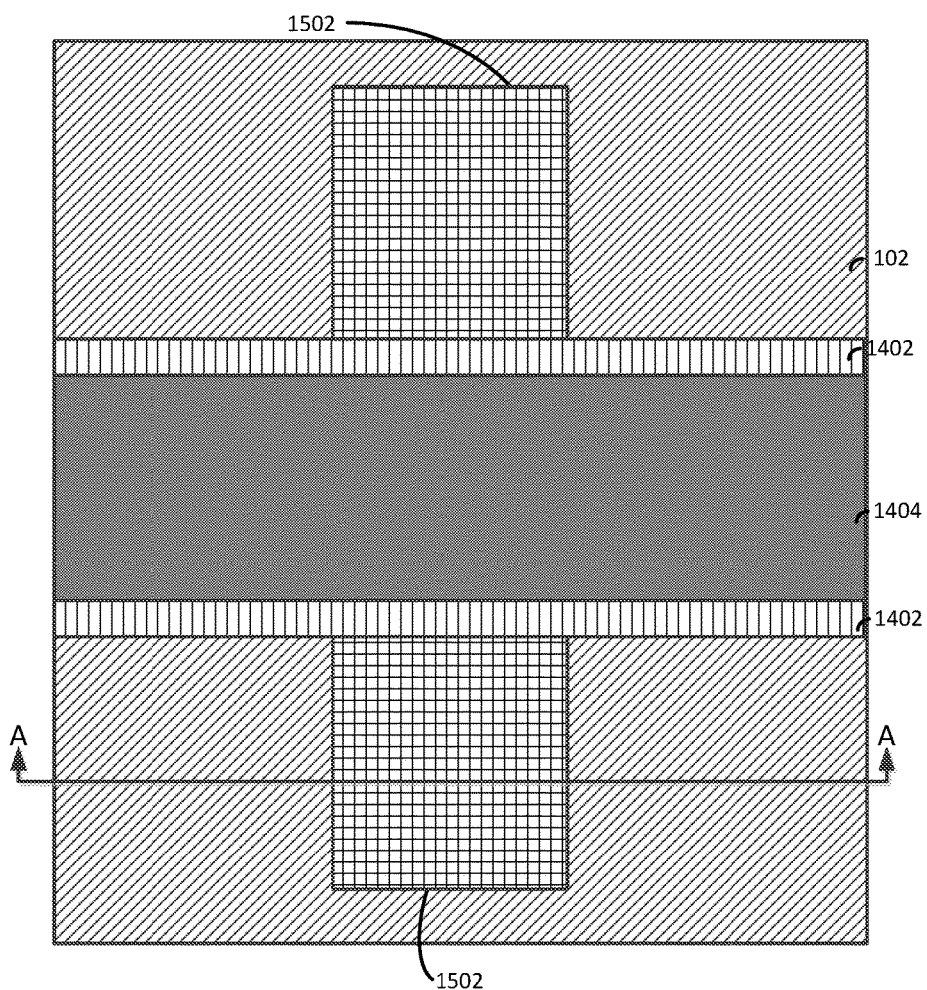

FIG. 15 illustrates a top view following the formation of source/drain regions 1502 over the fins 1102 (of FIG. 14). The source/drain regions 1502 are formed by an epitaxial growth process that deposits a crystalline overlayer of semiconductor material onto the exposed crystalline seed material of the exposed fin 1202 to form the source/drain regions 1502.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or between $2\times10^{20}$ cm$^{-3}$ and $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 16:
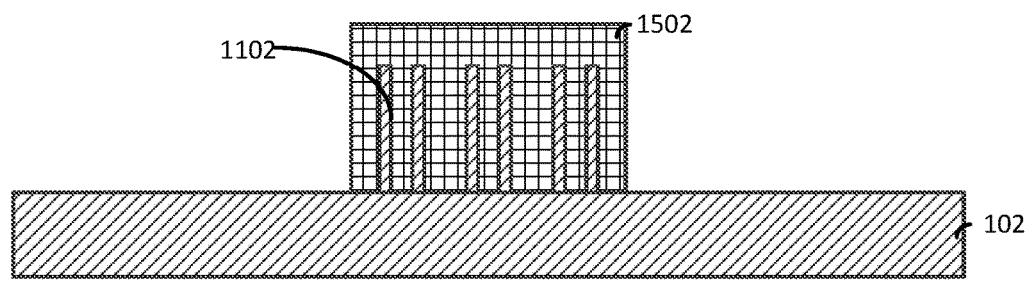

FIG. 16 illustrates a cut-away view along the line A-A (of FIG. 15) of the fins 1102 the substrate 102 and the source/drain region 1502 formed over the fins 1102 and the substrate 102.

Figure 17:
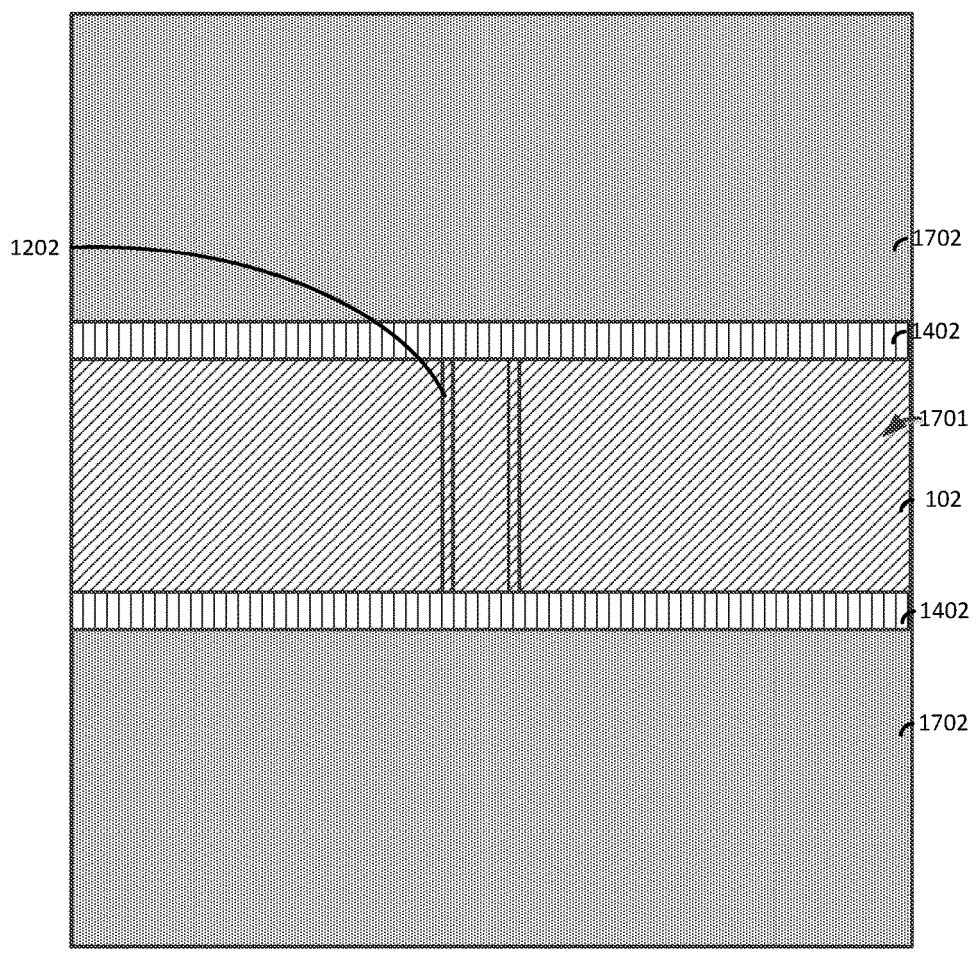

FIG. 17 illustrates a top view following the formation of an inter-level dielectric layer 1702 and the removal of the sacrificial gate 1404 (of FIG. 15) to form a cavity 1701 that exposes the channel regions of the fins 1202. The inter-level dielectric layer 1702 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1702 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1702, a planarization process such as, for example, chemical mechanical polishing is performed.

The sacrificial gates 1404 may be removed by performing a dry etch process, for example, RIE, followed by a wet etch process. The wet etch process is selective to (will not substantially etch) the spacers 1402 and the inter-level dielectric material. The chemical etch process may include, but is not limited to, hot ammonia or tetramethylammonium hydroxide (TMAH).

Figure 18:
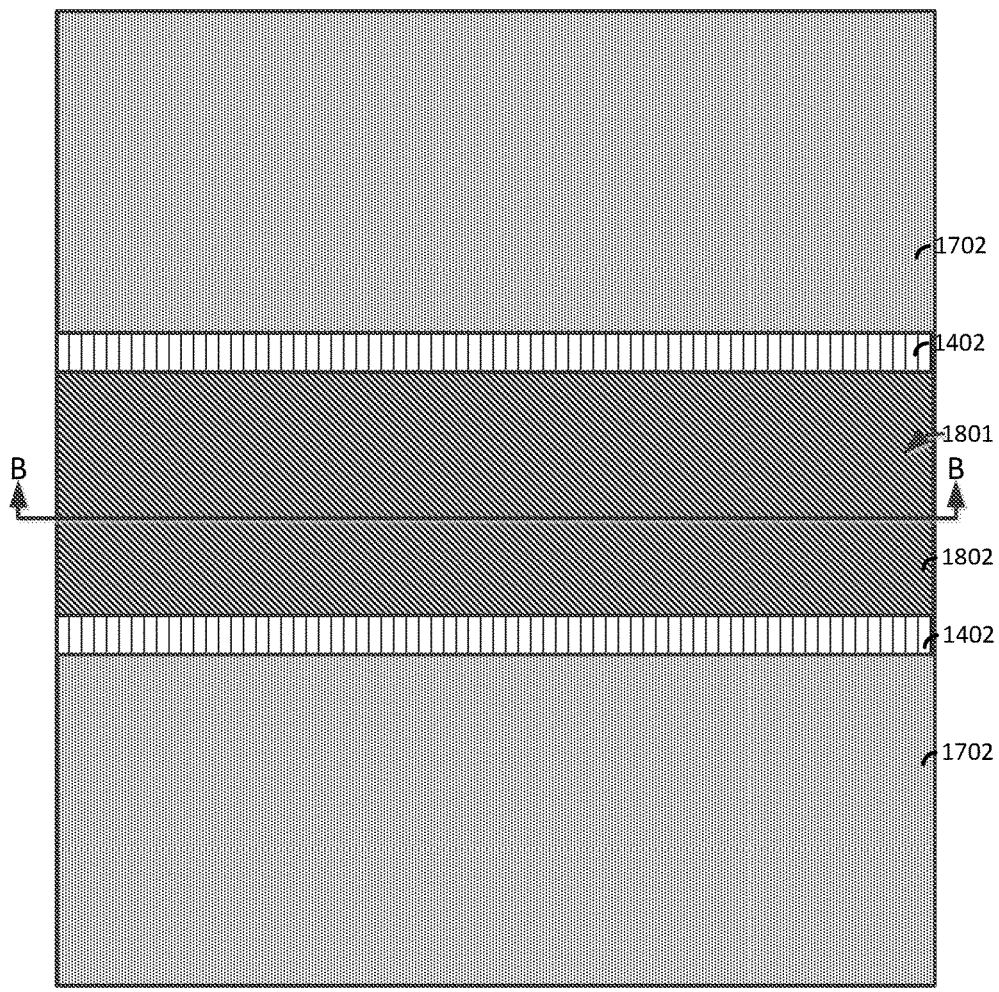
Figure 19:
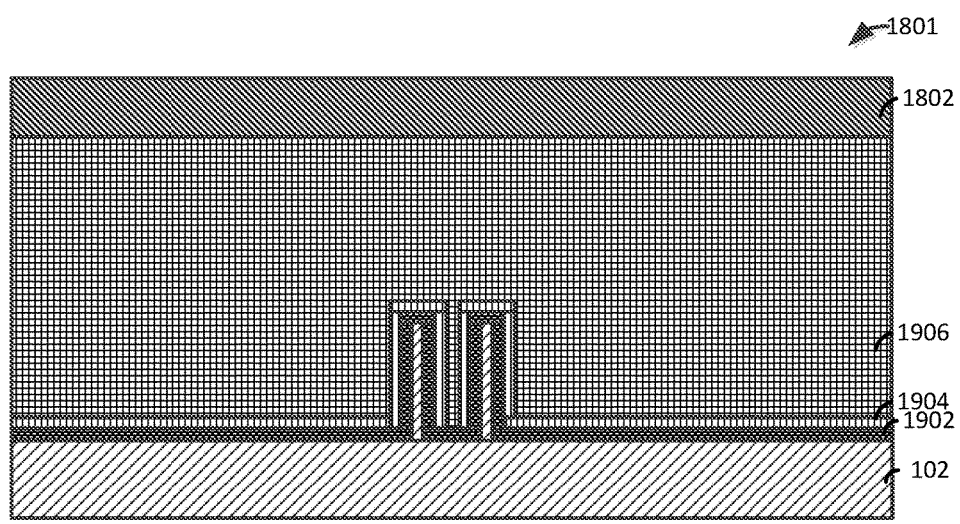

FIG. 18 illustrates a top view of the resultant structure following the formation of a replacement metal gate stack (gate stack) 1801. FIG. 19 illustrates a cut-away view along the line B-B (of FIG. 18) of the gate stack 1801. The gate stack 1801 includes high-k metal gates formed, for example, by filling the cavity 1701 (of FIG. 17) with one or more gate dielectric 1902 materials, one or more workfunction metals 1904, one or more metal gate conductor 1906 materials, and a gate cap 1802. The gate dielectric 1902 material(s) can be a dielectric material having a dielectric constant greater than 3.9, 7.0, or 10.0. Non-limiting examples of suitable materials for the dielectric 1902 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1902 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1904 may be disposed over the gate dielectric 1902 material. The type of work function metal(s) 1904 depends on the type of transistor and may differ between the nFET and pFET devices. Non-limiting examples of suitable work function metals 1904 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1906 material(s) is deposited over the gate dielectric 1902 materials and work function metal(s) 1904 to form the gate stack 1801. Non-limiting examples of suitable conductive metals include aluminum (Al), platinum (Pt), gold (Au), tungsten (W), titanium (Ti), or any combination thereof. The gate conductor 1906 material(s) may be deposited by a suitable deposition process, for example, CVD, PECVD, PVD, plating, thermal or e-beam evaporation, and sputtering.

Following the deposition of the gate dielectric 1902 materials, the work function metal(s) 1904, and the gate conductor 1906 material(s), planarization process, for example, chemical mechanical planarization (CMP), is performed to remove the overburden of the deposited gate materials and form the gate stack 1801.

FIGS. 20-25 illustrate an exemplary method for fabricating a finFET device using a sidewall image transfer process with fins having a greater fin pitch in the channel region and a smaller fin pitch in the source/drain regions.

Figure 20:
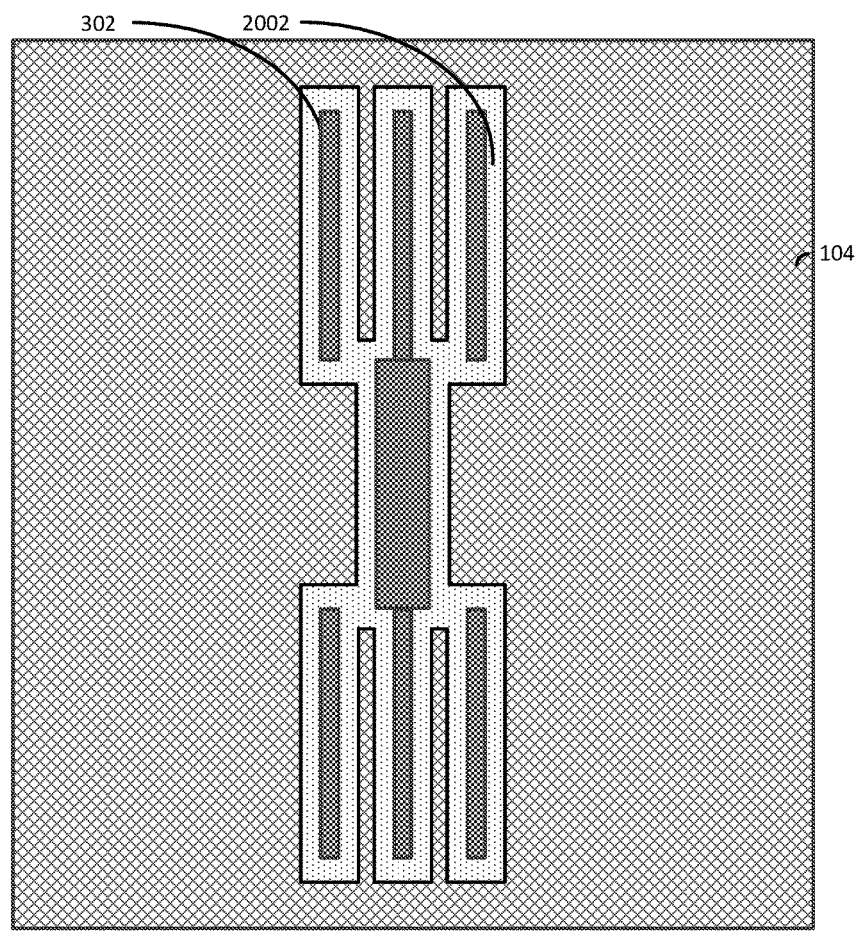
FIGS. 20-25 illustrate an exemplary method for fabricating a finFET device using a sidewall image transfer process with fins having a greater fin pitch in the channel region and a smaller fin pitch in the source/drain regions.

FIG. 20 illustrates a top view of following the formation of sacrificial sidewall spacers 2002 along sidewalls of the mandrel 302. The resultant structure is formed using a similar process as described above in FIGS. 1-6 however; the sacrificial sidewall spacers 2002 are wider than the sacrificial sidewall spacers 602 (of FIG. 6). The sacrificial sidewall spacers 2002 may be formed by depositing a relatively thicker layer of spacer material followed by an etch back process that forms the sacrificial sidewall spacers 2002.

Figure 21:
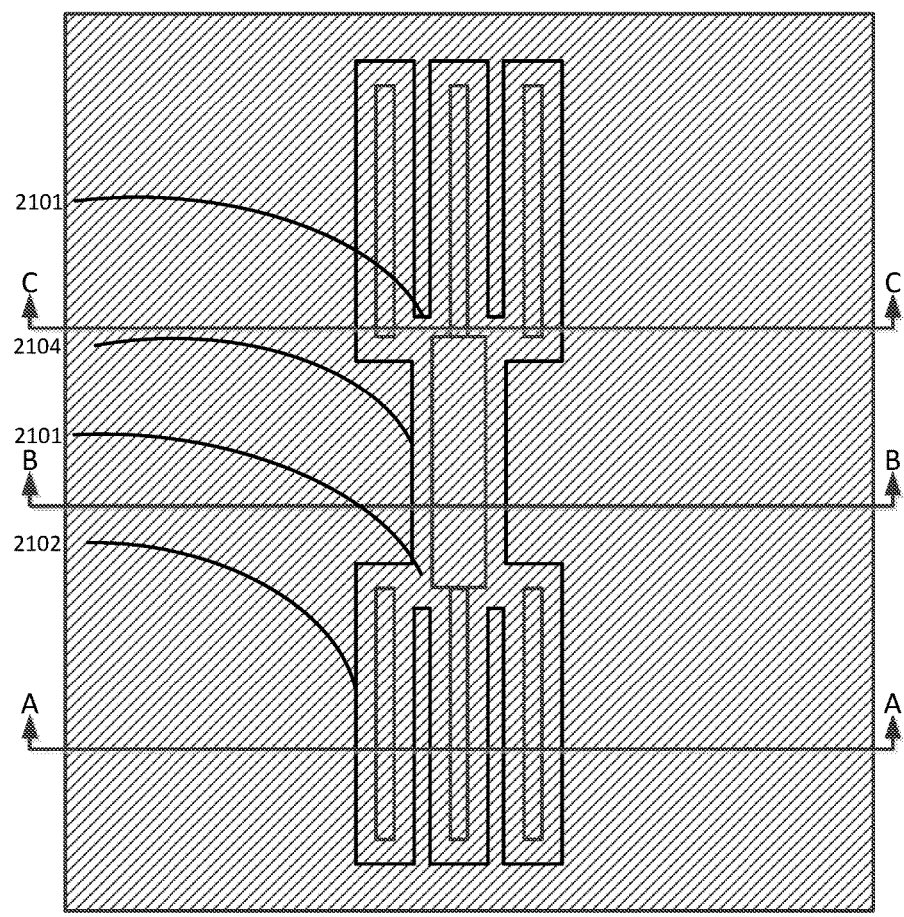
Figure 22:
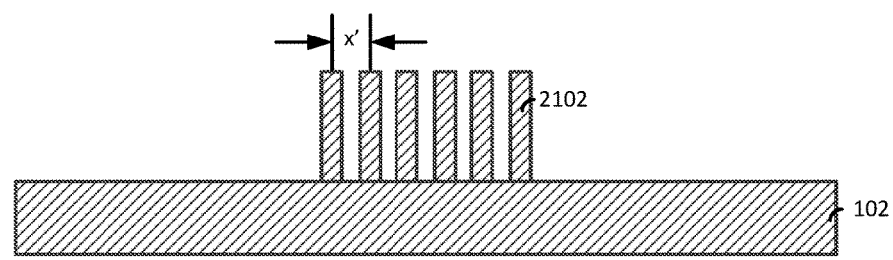
Figure 23:
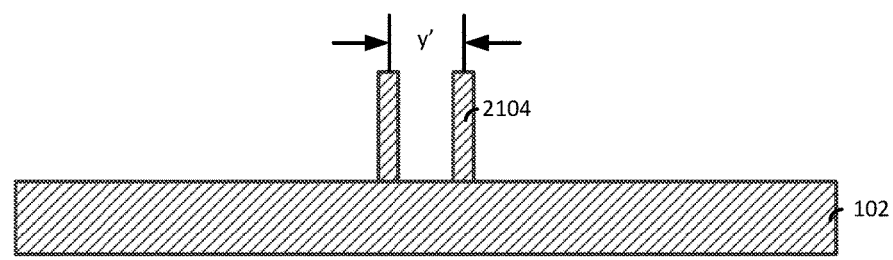
Figure 24:
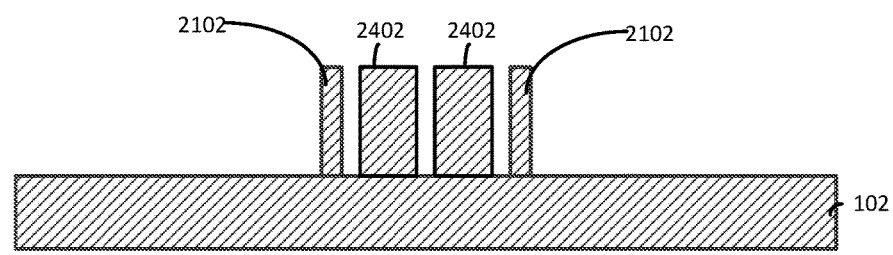

FIG. 21 illustrates a top view following an anisotropic etching process that removes exposed portions of the substrate 102 and forms fins 2102 and 2104. Following the formation of the fins 2102 and 2104, the sacrificial sidewall spacer 2002 is removed using, for example a selective etching process. FIG. 22 illustrates a cut-away view along the line A-A (of FIG. 21) of the fins 2102. FIG. 23 illustrates a cut-away view along the line B-B (of FIG. 21) of the fins 2104. FIG. 24 illustrates a cut-away view along the line C-C (of FIG. 21) of the fins 2102 and a merged fin portion 2402. The merged fin portion 2402 is partially defined by the intersection of the fins 2102 and 2104. The fins 2102 are spaced (pitched) a distance x' and will be used in subsequent fabrication processes to form the source/drain regions of the finFET device. The fins 2104 that are pitched a distance y' and will be used in subsequent fabrication processes to form the channel region of the device. In the illustrated exemplary embodiment shown in FIGS. 22-23 the distance x' is less than the distance y'.

Figure 25:
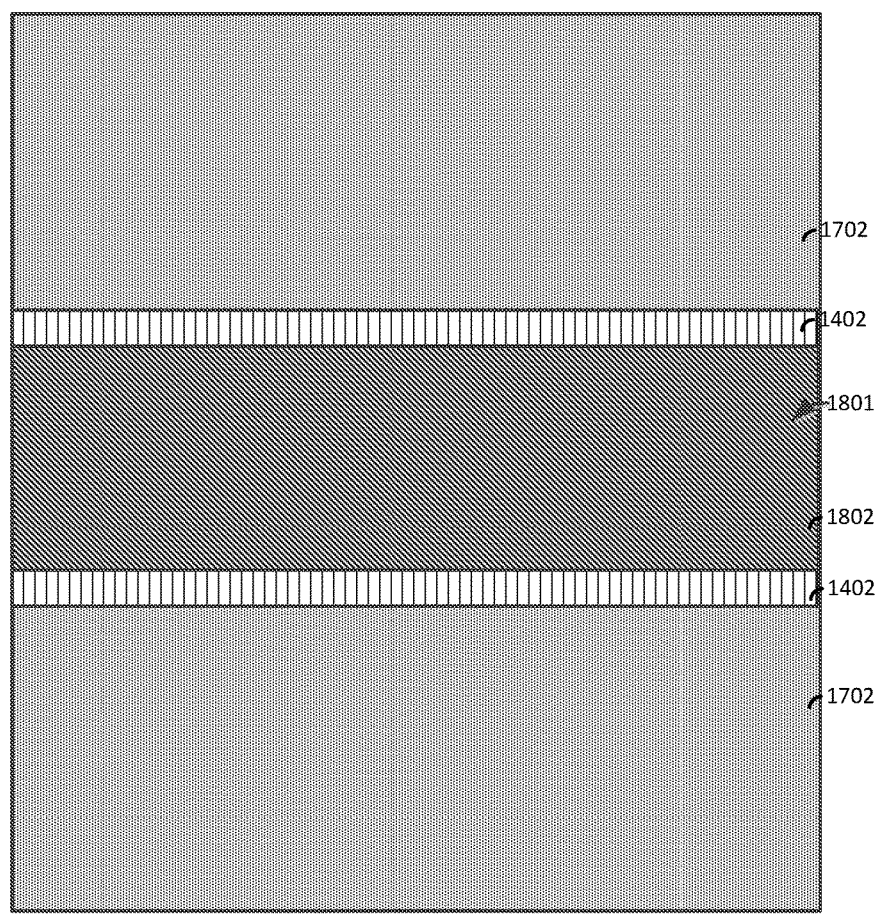

FIG. 25 illustrates a top view following the formation of a gate stack 1801 and spacers 1402 along sidewalls of the gate stack 1801 and an inter-level dielectric layer 1702 that are formed using a process similar to the gate stack formation process described above.

Figure 26:
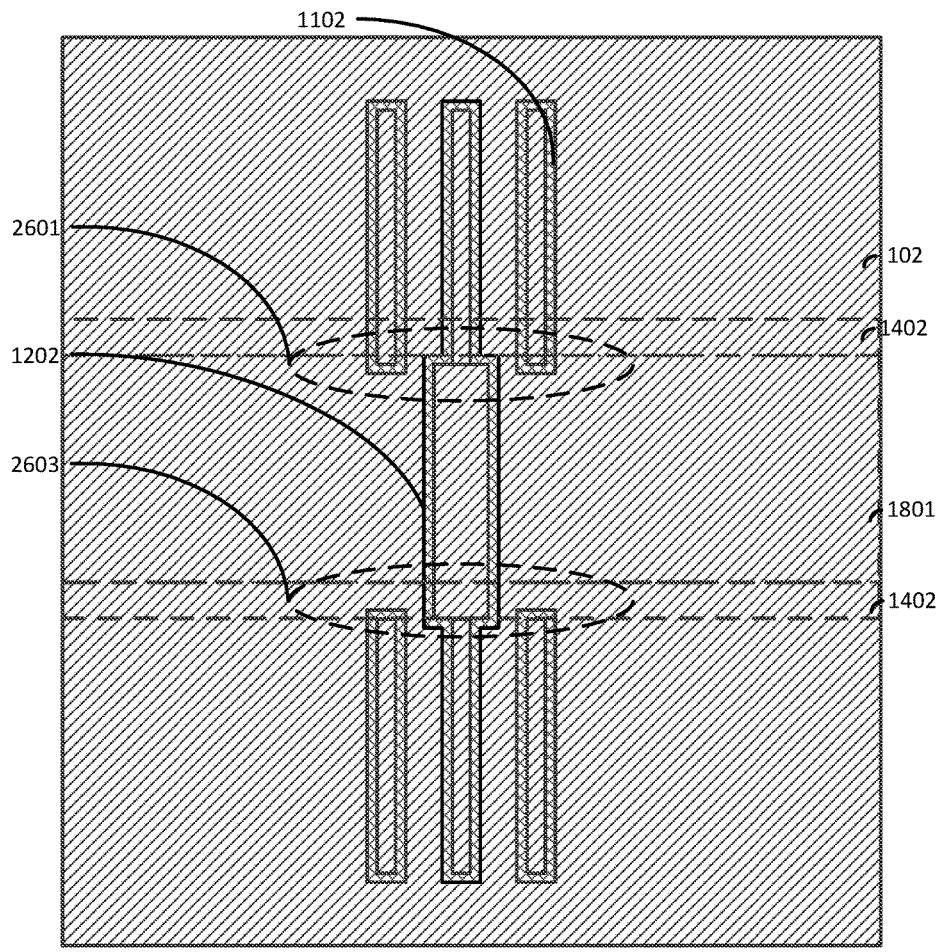
FIG. 26 illustrates a top view that is partially transparent of fins.

FIG. 26 illustrates a top view that is partially transparent of fins 1102 and 1202. FIG. 26 is similar to FIG. 14 described above however; the spacers 1402 and gate stack 1801 are slightly offset in alignment with the fins 1102 and 1202 such that portions of the fins 1102 in the region 2601 are arranged below the gate stack 1801. The offset in alignment of the gate stack 1801 results in portions of the fins 1202 in the region 2603 are arranged below the spacer 1402.

Figure 27:
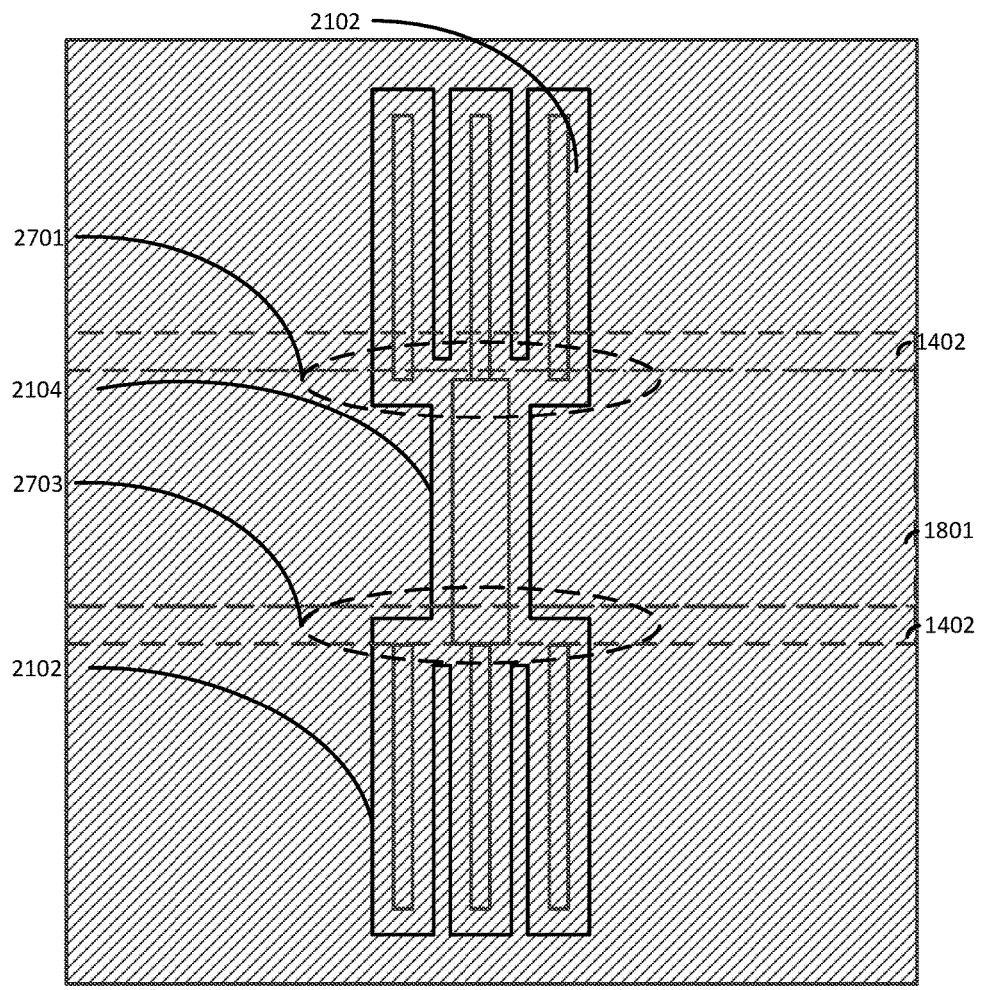
FIG. 27 illustrates a top view that is partially transparent of fins.

FIG. 27 illustrates a top view that is partially transparent of fins 2101 and 2104. FIG. 27 is similar to FIG. 21 described above however; the spacers 1402 and gate stack 1801 are slightly offset in alignment with the fins 2101 and 2104 such that portions of the fins 2101 in the region 2701 are arranged below the gate stack 1801. The offset in alignment of the gate stack 1801 results in portions of the fins 2101 in the region 2703 are arranged below the spacer 1402.

FIGS. 28-32 illustrate an exemplary direct patterning method for fabricating a finFET device having a greater fin pitch in the channel region and a smaller fin pitch in the source/drain regions.

Figure 28:
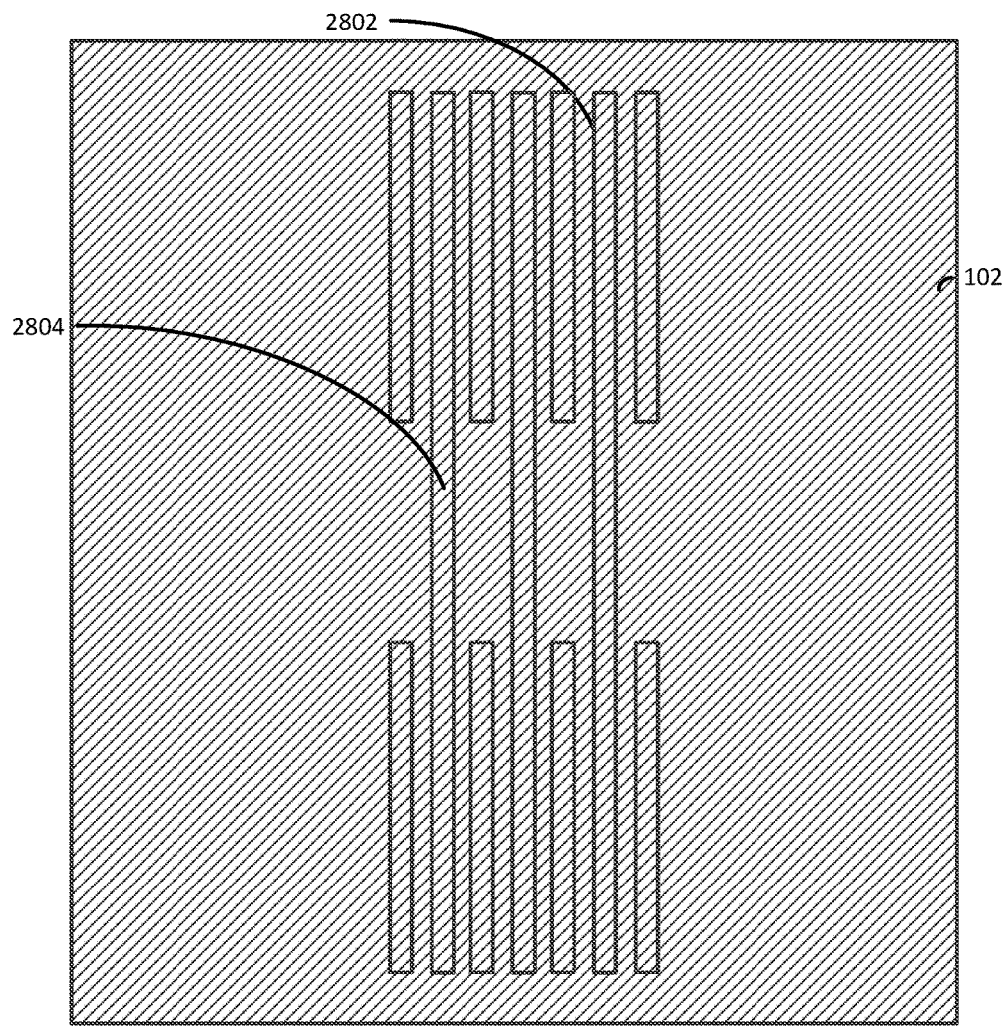
FIGS. 28-32 illustrate an exemplary direct patterning method for fabricating a finFET device having a greater fin pitch in the channel region and a smaller fin pitch in the source/drain regions.

FIG. 28 illustrates a top view of an arrangement of fins 2802 and fins 2804 on a substrate 102. The fins 2802 and fins 2804 in the illustrated embodiment have been formed by a lithographic patterning and etching process such as, for example, reactive ion etching that removes semiconductor material to form the fins 2802 and 2804.

Figure 29:
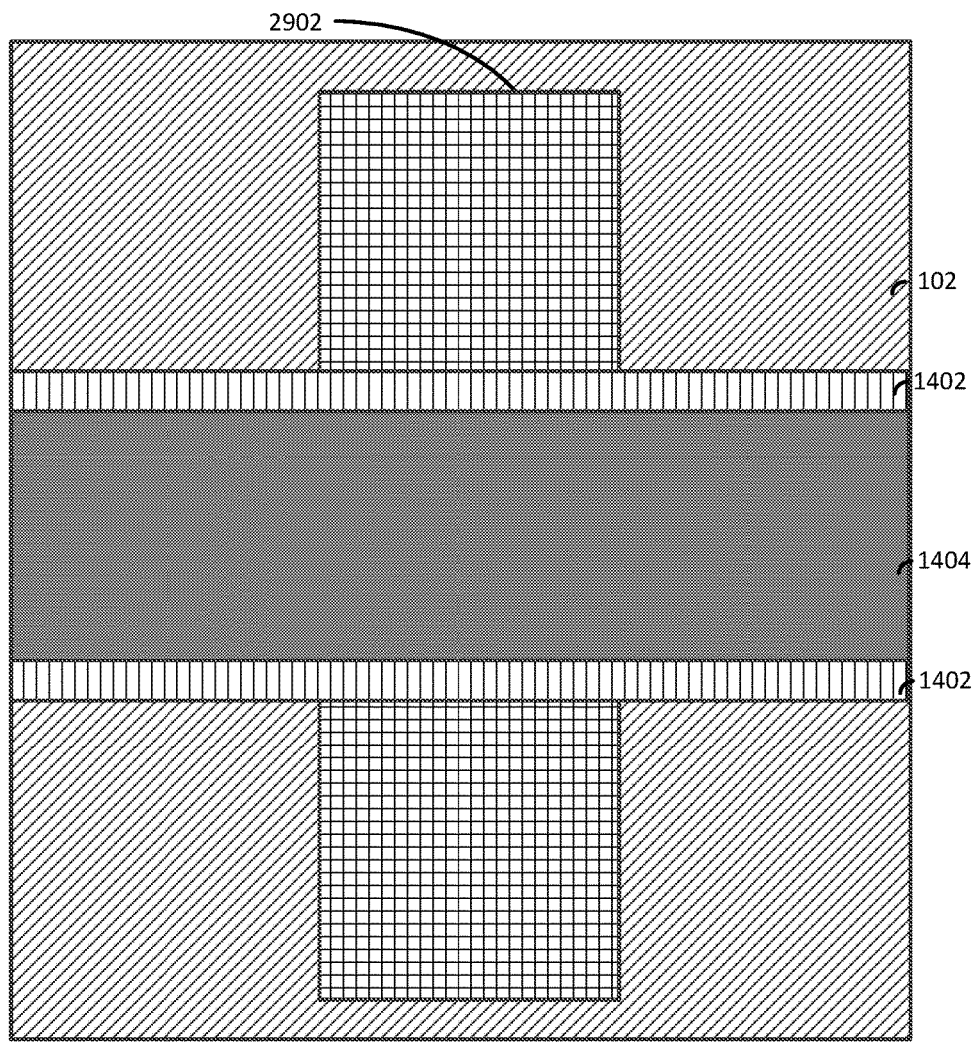

FIG. 29 illustrates a top view following the formation of a sacrificial gate stack 1404, spacers 1402, and source/drain regions 2902 over the fins 2802 (of FIG. 28) using a similar process as described above.

Figure 30:
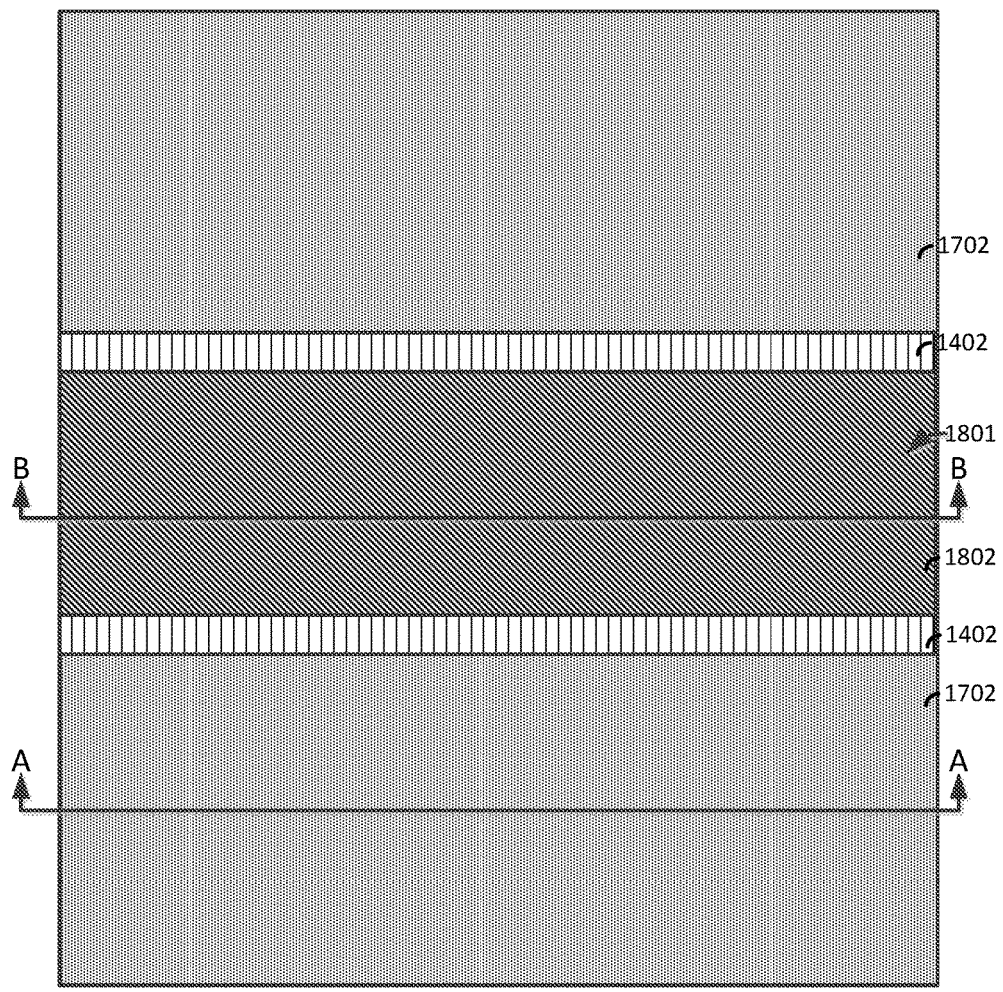

FIG. 30 illustrates a top view following the formation of an inter-level dielectric layer 1702 over the source/drain regions 2902 (of FIG. 29) and a replacement gate stack 1801 over channel regions of the fins 2804.

Figure 31:
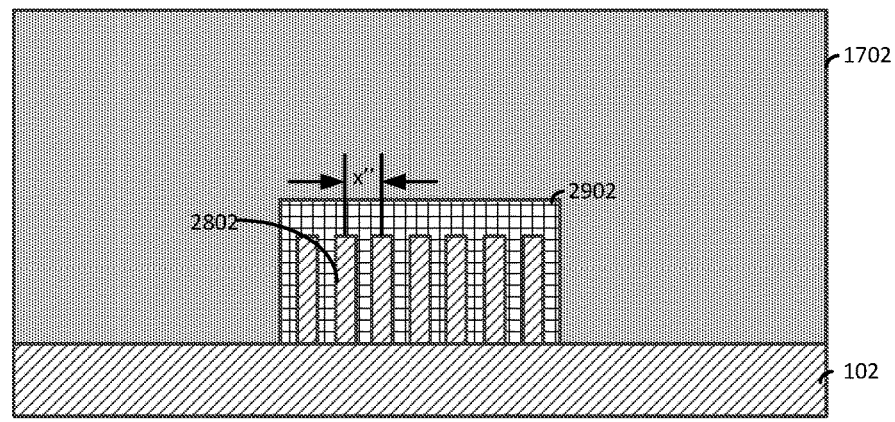
Figure 32:
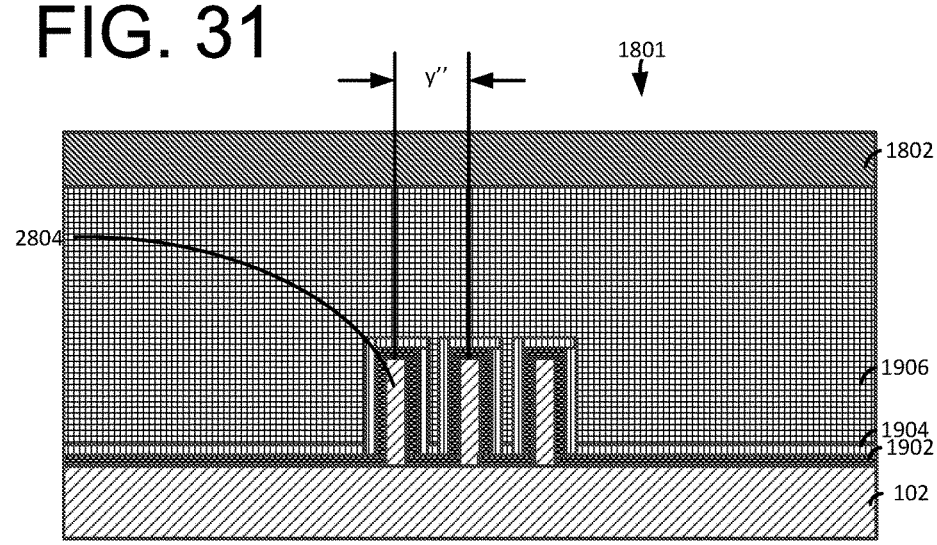

FIG. 31 illustrates a cut-away view along the line A-A (of FIG. 30) of the fins 2802 and the source/drain region 2902. FIG. 32 illustrates a cut-away view along the line B-B (of FIG. 30) of the fins 2804 and the gate stack 1802 arranged over the fins 2804. The fins 2802 are spaced (pitched) a distance x" and form a portion of the source/drain regions of the finFET device. The fins 2804 that are pitched a distance y" and will be used in subsequent fabrication processes to form the channel region of the device. In the illustrated exemplary embodiment shown in FIGS. 28-32 the distance x" is less than the distance y".

Figure 33:
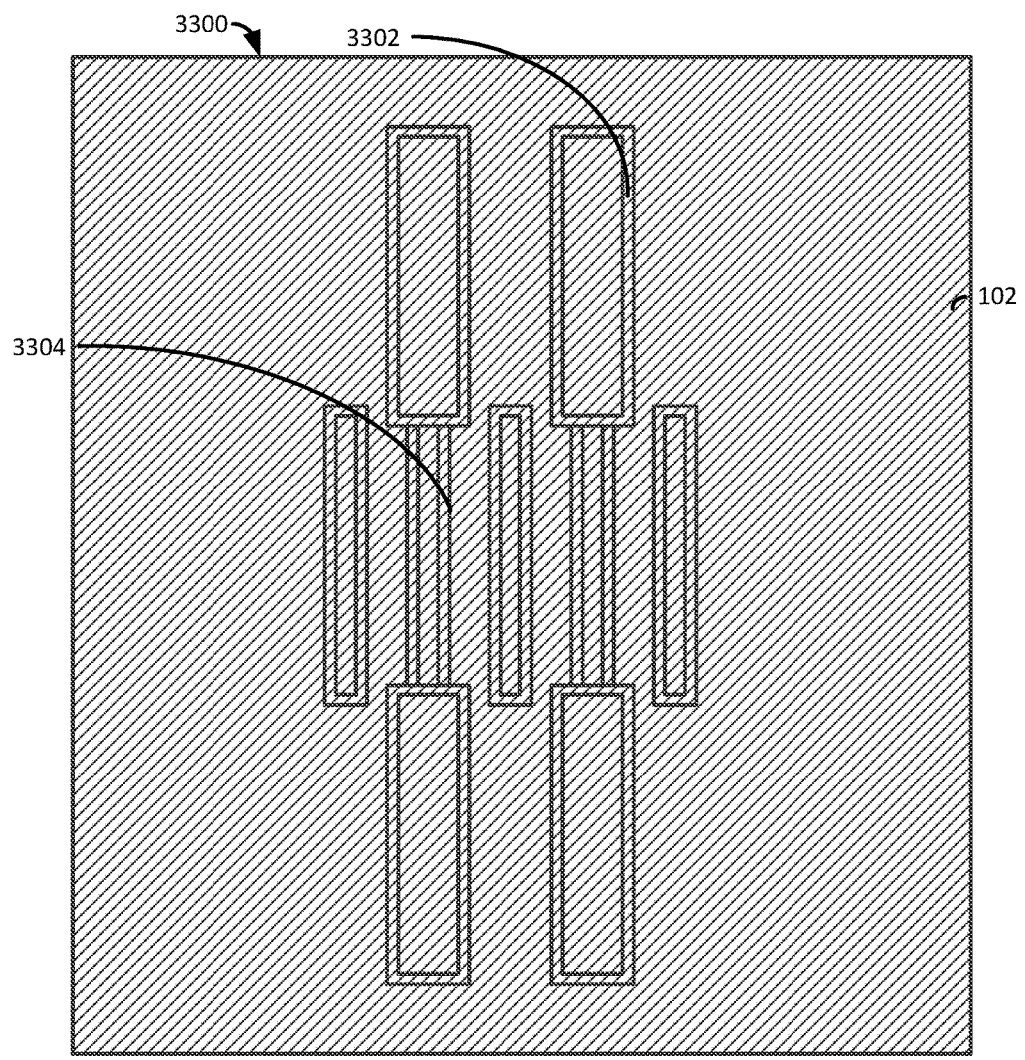
FIG. 33 illustrates a top view of an alternate exemplary arrangement of fins.

FIG. 33 illustrates a top view of an alternate exemplary arrangement of fins 3300. The fins 3300 are formed using a similar process as described above in FIGS. 1-13 however, the pattern of the fins is such that the fins 3302 that are arranged in the source/drain region have a larger pitch than the fins 3304 that are arranged in the channel region. Following the formation of the arrangement of the 3300, a similar process as described above in FIGS. 14-19 may be performed to form a finFET device with a gate stack over the fins 3304 and source/drain region over the fins 3302.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
    forming a first fin and a second fin on a substrate, the first fin arranged substantially in parallel with the second fin, the first fin arranged a first distance from the second fin, the first fin and the second fin extending from a first source/drain region through a channel region and into a second source/drain region on the substrate;
    forming a third fin on the substrate, the third fin arranged substantially in parallel with the first fin and between the first fin and the second fin, the third fin arranged a second distance from the first fin, the second distance is less than the first distance, the third fin having two distal ends arranged in the first source/drain region; and
    forming a gate stack over the first fin and the second fin in the channel region.

2. The method of claim 1, wherein the first fin, the second fin, and the third fin include a semiconductor material.

3. The method of claim 1, wherein the first fin, the second fin, and the third fin, are formed by an anisotropic etching process.

4. The method of claim 1, wherein forming the first fin, the second fin, and the third fin includes:
    forming a hardmask on the substrate; and
    performing a lithographic patterning and etching process to remove exposed portions of the hardmask and substrate materials to form the first fin, the second fin, and the third fin.

5. The method of claim 1, wherein a pitch of the first fin and the second fin is greater than a pitch of the first fin and the third fin.

6. The method of claim 1, wherein the gate stack includes a gate dielectric material, a workfunction metal, and a metal gate conductor material.

7. The method of claim 1, further comprising forming a spacer adjacent to the gate stack.

8. The method of claim 1, wherein the first source/drain region is formed by an epitaxial growth process.

9. The method of claim 3, wherein the anisotropic etching process includes reactive ion etching.

10. The method of claim 4, wherein the hardmask includes silicon oxide, silicon nitride, SiOCN, or SiBCN.

11. The method of claim 4, wherein the etching process includes reactive ion etching.

12. The method of claim 4, wherein the etching process includes a wet etching process.

13. The method of claim 6, wherein the workfunction metal includes a p-type work function material.

14. The method of claim 6, wherein the workfunction metal includes an n-type work function material.

15. The method of claim 6, wherein the metal gate conductor material includes aluminum, platinum, gold, tungsten, or titanium.

16. The method of claim 6, wherein the gate dielectric material includes an oxide, a nitride, an oxynitride, a metal silicate, an aluminate, a titanate, or a nitride.

17. The method of claim 6, wherein the gate dielectric material includes hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

18. The method of claim 13, wherein the p-type work function material includes ruthenium, palladium, platinum, cobalt, nickel, or a conductive metal oxide.

19. The method of claim 14, wherein the n-type work function material includes hafnium, zirconium, titanium, tantalum, aluminum, hafnium carbide, zirconium carbide, titanium carbide, and aluminum carbide, or an aluminide.

20. The method of claim 8, wherein the epitaxial growth process deposits a crystalline overlayer of semiconductor material.

* * * * *